United States Patent [19]
Ishibashi et al.

[11] Patent Number: 5,828,086
[45] Date of Patent: Oct. 27, 1998

[54] SEMICONDUCTOR LIGHT EMITTING DEVICE WITH A MG SUPERLATTICE STRUCTURE

[75] Inventors: Akira Ishibashi; Satoshi Matsumoto; Masaharu Nagai; Satoshi Ito, all of Kanagawa; Shigetaka Tomiya; Kazushi Nakano, both of Tokyo; Etsuo Morita, Kanagawa, all of Japan

[73] Assignee: Sony Corporation, Tokyo, Japan

[21] Appl. No.: 826,108

[22] Filed: Mar. 24, 1997

Related U.S. Application Data

[63] Continuation of Ser. No. 691,536, Aug. 2, 1996, Pat. No. 5,665,977, which is a continuation of Ser. No. 389,790, Feb. 16, 1995, abandoned.

[30] Foreign Application Priority Data

| Feb. 16, 1994 | [JP] | Japan | 6-041876 |
| May 31, 1994 | [JP] | Japan | 6-142641 |
| Jun. 21, 1994 | [JP] | Japan | 6-162770 |
| Aug. 5, 1994 | [JP] | Japan | 6-204245 |

[51] Int. Cl.$^6$ .................................................. H01L 33/00
[52] U.S. Cl. .......................... 257/94; 257/97; 257/96; 257/103; 372/43; 372/44; 372/45
[58] Field of Search .................................. 257/21, 94, 96, 257/97, 103; 372/43, 44, 45

[56] References Cited

U.S. PATENT DOCUMENTS

| 4,866,489 | 9/1989 | Yokogawa et al. | 359/326 |
| 5,012,476 | 4/1991 | Razeghi et al. | 372/45 |
| 5,045,897 | 9/1991 | Ahlgren | 257/94 |
| 5,117,477 | 5/1992 | Satoh | 385/88 |
| 5,268,918 | 12/1993 | Akimoto et al. | 372/45 |
| 5,617,446 | 4/1997 | Ishibashi et al. | 372/96 |

*Primary Examiner*—William Mintel
*Attorney, Agent, or Firm*—Hill, Steadman & Simpson

[57] ABSTRACT

A semiconductor light emitting device ccomprises a first cladding layer, an active layer and a second cladding layer which are stacked on a semiconductor substrate. At least a part of the first cladding layer and the second cladding layer has a superlattice structure comprising II–VI compound semiconductor. Another semiconductor light emitting device comprises a first cladding layer, a first guide layer, an active layer, a second guide layer and a second cladding layer which are stacked on a semiconductor substrate. At least a part of the first cladding layer, the first guide layer, the second cladding layer and the second guide layer has a superlattice structure. Still anothr semiconductor light emitting device comprises a defect decomposing layer, a defect blocking layer, a first cladding layer, an active layer, a second cladding layer which are stacked on a semiconductor substrate. The defect decomposing layer and the defect blocking layer comprise a superlattice structure.

6 Claims, 16 Drawing Sheets

CAVITY LENGTH DIRECTION

QUANTUM WELL WIDTH (ATOMIC LAYER)

QUANTUM WELL WIDTH (ATOMIC LAYER)

QUANTUM WELL WIDTH (ATOMIC LAYER)

QUANTUM WELL WIDTH (ATOMIC LAYER)

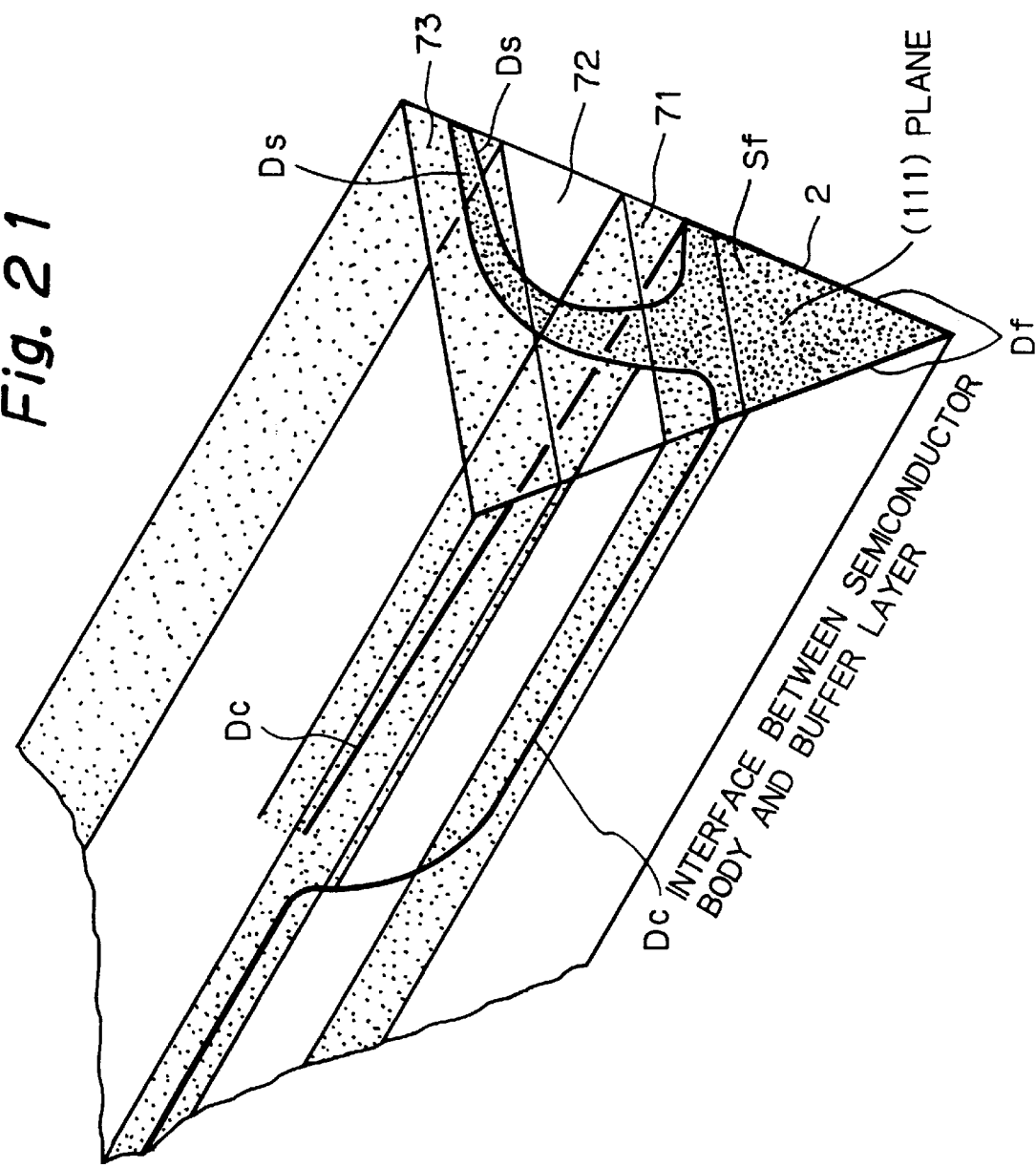

SEMICONDUCTOR LIGHT EMITTING DEVICE WITH A MG SUPERLATTICE STRUCTURE

This is a continuation of application Ser. No. 08/691,536, filed Aug. 2, 1996, now U.S. Pat. No. 5,665,977, which was a continuation of Ser. No. 08/389,790, filed Feb. 16, 1995, and now abandoned.

BACKGROUND OF THE INVENTION

1. Field of the Invention

This invention relates to a semiconductor light emitting device or other like devices and, more particularly, to a semiconductor light emitting device comprising II–VI compound semiconductors.

2. Related Arts

Recently, II–VI compound semiconductors are used as materials of light emitting devices such as light emitting diodes, semiconductor lasers, and so on. They are fabricated by epitaxial growth of one or more II–VI semiconductors on a (100)-oriented semiconductor substrate by, for example, molecular beam epitaxy (MBE).

Examples of short-wavelength light sources (mainly, blue light sources), for use as light sources for high-density optical recording and displays, include light emitting devices in which a II–VI compound semiconductor such as ZnCdSe, or the like, is stacked by crystal growth by MBE. These light emitting devices have attained continuous oscillation at room temperatures.

Upon making the epitaxially grown layer on the substrate, defects such as stacking faults occur along the interface between the substrate and the epitaxially grown layer. In order to restrict growth of such defects, some attempts have been made to improve the pre-treatment of the substrate to be performed before crystal growth or to improve the method of growth at the beginning of the epitaxial growth.

However, lifetimes of continuous oscillation of these light emitting devices at the room temperature are still as short as only several seconds, far from practically acceptable levels.

One of the reasons is insufficient crystalline qualities of active layers for light emission, guide layers and cladding layers.

It is known through TEM observation that II–VI compound semiconductor layers made by epitaxial growth ordinarily include about $10^6$~$10^7 cm^{-2}$ defects.

Moreover, stacking faults often occur at the interface between the base body and II–VI compound semiconductors stacked by epitaxial growth.

If the guide, or active, layer is made on the epitaxially grown layer including such defects, then its crystal growth progresses while trailing the defects, and does not result in a good quality. If such defects remain, they move or multiply during laser oscillation due to the process of recombination of excessive carriers in the crystal, which causes deterioration of the crystalline quality at a great speed and deterioration of the oscillating characteristic of the light emitting device.

The defects also cause problems regarding the optical characteristics of the grown crystal, such as light emission from a deep level, non-radiative center, or the like. They further give a bad influence to electric characteristics such as compensation of impurities. These factors invite a decrease in light emitting characteristics of light emitting devices.

Moreover, existing II–VI compound optical semiconductor devices use a ZnCdSe single-quantum well layer as their active layer. This layer, however, is lattice-mismatched with a GaAs substrate, and a compressive stress is applied to the active layer. This stress is a factor that promotes multiplication of defects during electrical energization under the existence of misfit dislocations in the active layer. Due to the existence of a number of defects in the active layer, in addition to the structure liable to promote the motion of dislocation, semiconductor lasers so far available have only short lifetimes.

OBJECTS AND SUMMARY OF THE INVENTION

It is, therefore, an object of the invention to provide a light emitting device capable of increasing the hole concentration of its p-type cladding layer.

A further object of the invention is to provide a light emitting device permitting its cladding layer to be made of any material selected from a wide range.

A still further object of the invention is to provide a light emitting device free from the influence of defects in the crystal and excellent in crystalline quality of its active layer and its peripheral layers.

According to an aspect of the invention, there is provided a semiconductor light emitting device comprising: a first cladding layer, an active layer, and a second cladding layer, which are stacked on a semiconductor substrate, at least a part of the first cladding layer and the second cladding layer having a superlattice structure comprising a II–VI compound semiconductor.

According to another aspect of the invention, there is provided a semiconductor light emitting device comprising: a first cladding layer, a first guide layer, an active layer, a second guide layer, and a second cladding layer, at least a part of the first cladding layer, the first guide layer, the second cladding layer and the second guide layer has a superlattice structure comprising a II–VI compound semiconductors.

According to still another aspect of the invention, there is provided a semiconductor light emitting device comprising: a defect decomposing layer, a defect blocking layer, a first cladding layer, an active layer and a second cladding layer, which are stacked on a semiconductor substrate, the defect decomposing layer and the defect blocking layer comprising superlattice structures.

The superlattice structure used in the light emitting device according to the invention gives the following effects to the light emitting device according to the invention.

First, by making the superlattice structure in a part or the entirety of the cladding layer of the light emitting device, a self-compensating effect of the II–VI compound semiconductor can be suppressed. It can also play the function as a multiquantum barrier, too.

Secondly, by making the superlattice structure between the semiconductor substrate and the active layer of the light emitting device, growth of defects such as stacking faults generated at the interface between the semiconductor body and the II–VI compound semiconductor layer can be suppressed at the interface of the superlattice structure. In addition, when any distortion in the superlattice itself is canceled in each layer of the well and the barrier, no distortion occurs in the superlattice itself. Therefore, the crystalline quality of the II–VI compound semiconductor layer on the superlattice is made high. Further, by providing 2 sets of superlattice structures, any stacking fault generated at the interface between the semiconductor substrate and the II–VI compound semiconductor layer can be decomposed into line defects, or the like, and growth of the line defects, etc. can be suppressed.

The above, and other, objects, features and advantage of the present invention will become readily apparent form the following detailed description thereof which is to be read in connection with the accompanying drawings.

BRIEF DESCRIPTION OF THE DRAWINGS

FIG. 21 is an explanatory view of behaviors of a defect decomposing layer and a defect blocking layer.

DETAILED DESCRIPTION OF THE PREFERRED EMBODIMENTS

Figure 1:
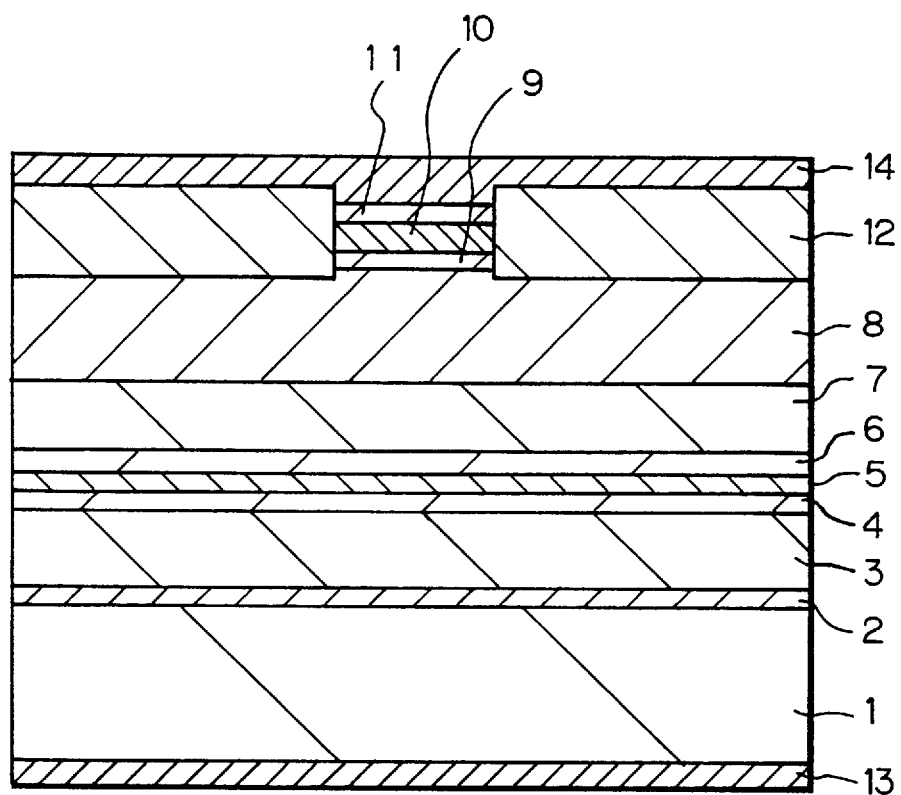
FIG. 1 is a cross-sectional view showing a semiconductor laser according to a first embodiment of the invention.
Figure 2:
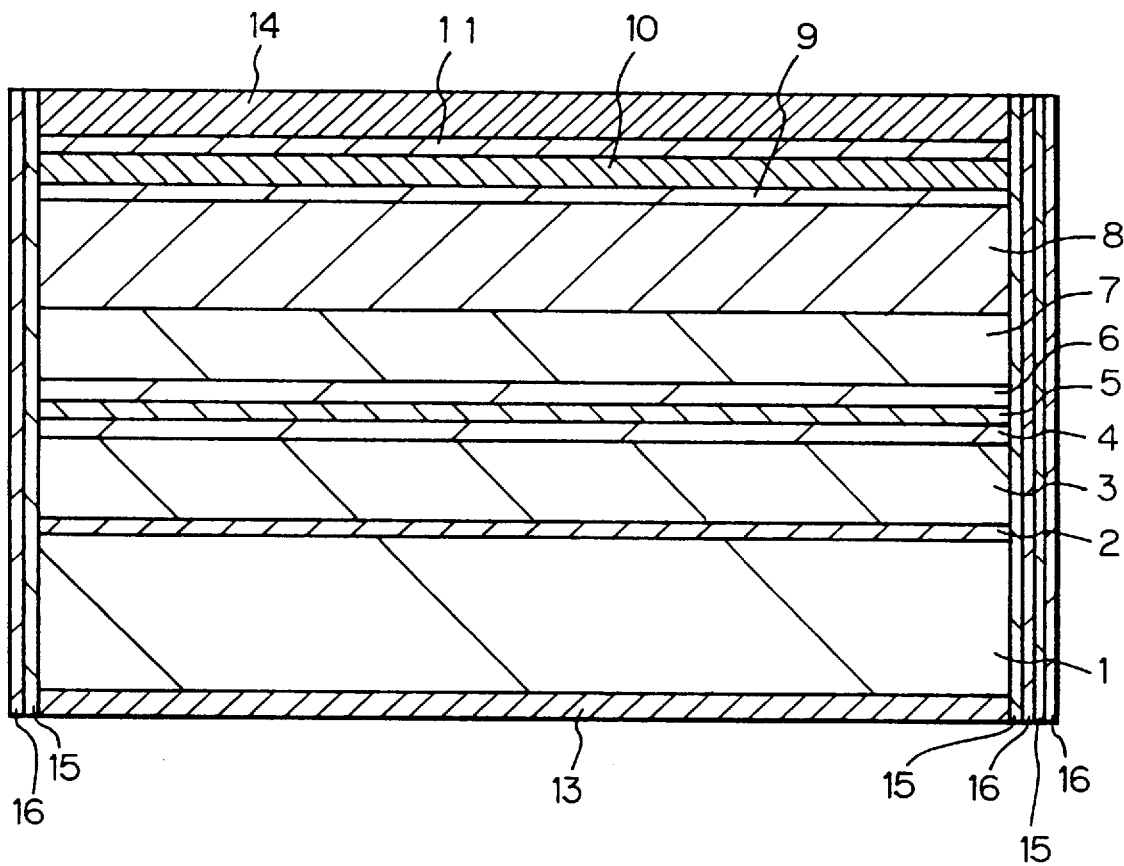
FIG. 2 is a cross-sectional view showing the semiconductor laser according to the first embodiment of the invention.

FIGS. 1 and 2 illustrate a semiconductor laser taken as a first embodiment of the invention. FIG. 1 shows a cross section orthogonal to the cavity length direction of the semiconductor laser, and FIG. 2 shows a cross section parallel to the cavity length direction.

The semiconductor laser shown in FIG. 1 comprises an n-type ZnSe buffer layer 2, an n-type ZnSe/MgS cladding layer 3, an n-type ZnSe waveguide layer 4, an active layer 5, a p-type ZnSe waveguide layer 6, p-type ZnSe/MgS superlattice cladding layer 7 and a p-type ZnSSe layer 8 which are stacked in sequence on an n-type GaAs substrate. Further stacked on the p-type ZnSSe layer 8 are a p-type ZnSe contact layer 9, a p-type ZnSe/ZnTe MQW layer 10 and a p-type ZnTe contact layer 11 in sequence in the form of a stripe. Opposite sides of the p-type ZnSe contact layer 9, p-type ZnSe/ZnTe MQW layer 10 and p-type ZnTe contact layer 11 are filled with an insulator 12 such as $Al_2O_3$. Formed on the lower surface of the n-type GaAs substrate 1 and on the upper surfaces of the p-type ZnTe contact layer 11 and the insulating layer 12 are an n-side electrode 13 and a p-side electrode 14, respectively.

Figure 3:
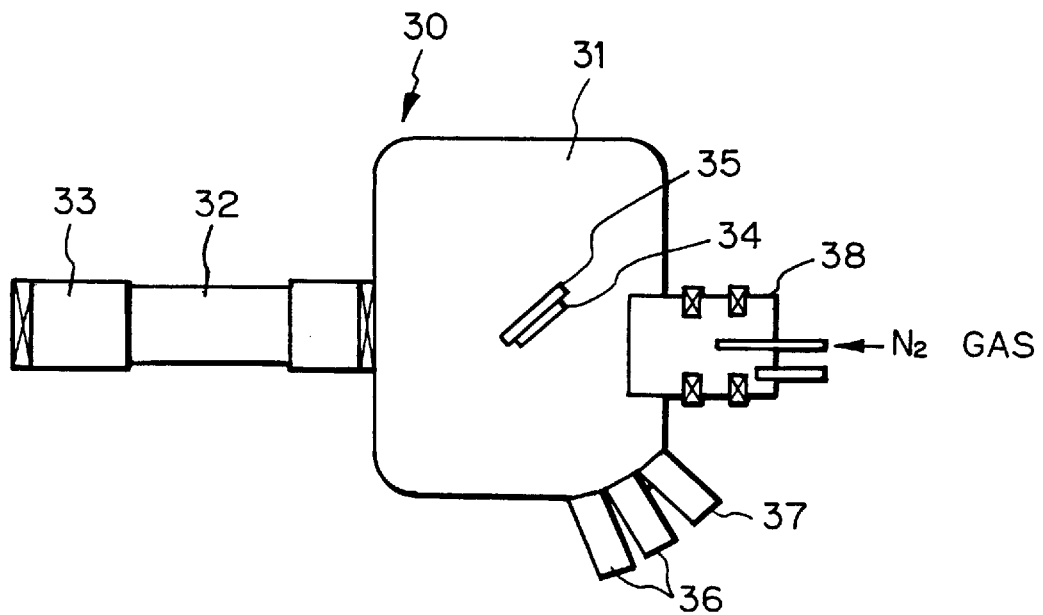
FIG. 3 is a schematic diagram of the construction of an MBE apparatus.

The respective layers of the semiconductor laser shown in FIG. 1 are made by epitaxial growth by, for example, MBE. An MBE growth apparatus is explained below with reference to the schematic diagram of FIG. 3. As shown in FIG. 3, the MBE growth apparatus 30 defines a chamber 31 for crystal growth of II–VI compound semiconductors. The chamber 31 communicates with a preparatory chamber 33 through a conveyor chamber 32. The chamber 31 contains a holder 35 for supporting a substrate 34. The chamber 31 is also equipped with, for example, Knudsen cells 36 of Zn, Cd, Mg, Se, ZnS, Te, etc. for growth of II–VI compound semiconductors. Further provided are a cell 37 for containing $ZnCl_2$ for doping and a gun 38 for electron cyclotron resonance (ECR) plasma doping of nitrogen gas.

The epitaxial growth uses, for example, Zn of purity 99.9999% as a source material of Zn, Mg of purity 99.9% as a source material of Mg, ZnS of purity 99.9999% as a source material of S, and Se of purity 99.9999% as a source material of Se. Doping of Cl as a donor impurity for the n-type semiconductor layer is done by using, for example, $ZnCl_2$ of purity 99.9999% as a dopant. Doping of N as an acceptor impurity for the p-type semiconductor layer is done by irradiating $N_2$ plasma blasted by, for example, ECR. As to the p-type ZnSe/MgS superlattice cladding layer 7, modulation doping may be employed to selectively dope N only into the ZnSe layer.

Next, a stripe-shaped resist pattern (not shown) with a predetermined width is formed on the p-type ZnTe contact layer 11. By using the resist pattern as a mask, the p-type ZnSSe layer 8 is etched off up to a middle portion in its thickness direction by wet etching. As a result, the upper portion of the p-type ZnSSe layer 8, p-type ZnSe contact layer 9, p-type ZnSe/ZnTe MQW layer 10, p-type ZnTe contact layer 11 are patterned into the form of a stripe.

While the resist pattern used for the etching is maintained, an $Al_2O_3$ film is formed on the entire surface by vacuum evaporation. After that, the resist pattern is removed together with the $Al_2O_3$ formed on it (lift-off). As a result, the insulating film 12 in the form of the $Al_2O_3$ film is formed only on the part of the p-type ZnSSe layer 8 except for the stripe portion.

FIG. 2 shows end-surface coating along opposite end surfaces of the cavity, orthogonal to the cavity length direction. The front one of the cavity end surfaces, from which laser light is taken out, is coated with a multi-layered film comprising an $Al_2O_3$ film 15 and a Si film 16. The rear one of the cavity end surfaces is coated with a multi-layered film comprising a two-cycle lamination of $Al_2O_3$ films 15 and Si films 16. The thickness of the multi-layered films of the $Al_2O_3$ film or films 15 and the Si film or films 16 are chosen such that the optical distance corresponding to the thickness multiplied by the refractive index equals ¼ of the oscillation wavelength of the laser light. The end-surface coating can provide reflectivities of, for example, 70% at the front side and 95% at the rear side.

Figure 4:
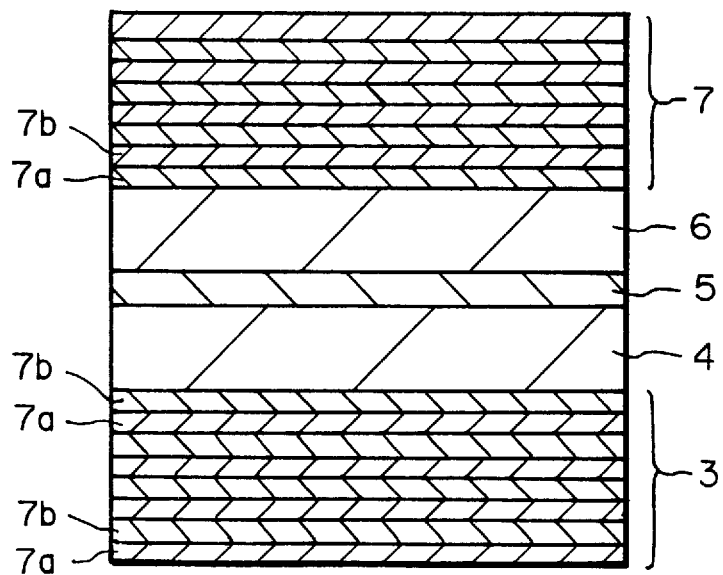
FIG. 4 is a cross-sectional view showing a part of the semiconductor laser according to the first embodiment of the invention.
Figure 5:
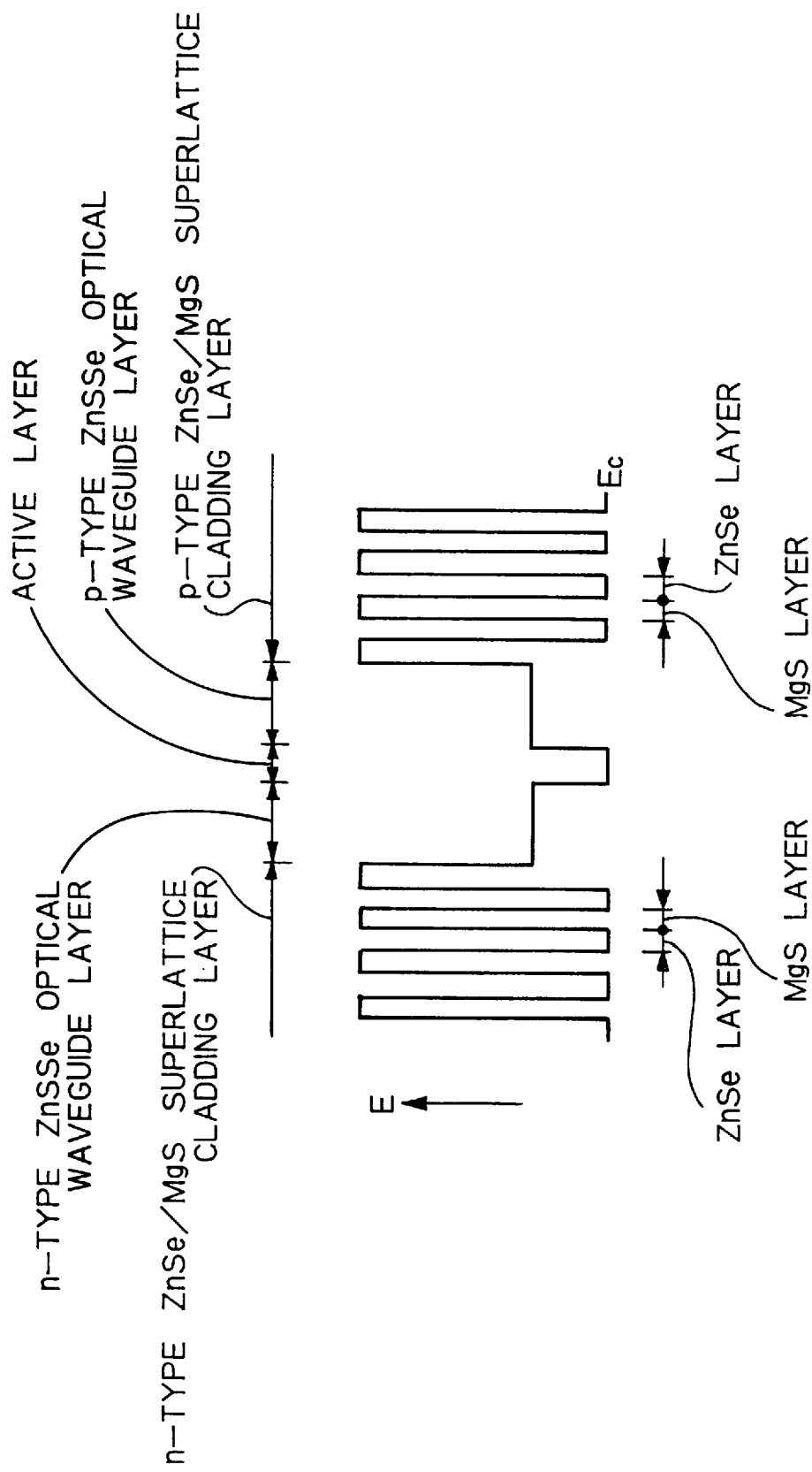
FIG. 5 is an energy band diagram of a part of the semiconductor laser according to the first embodiment of the invention.

FIG. 4 shows a cross-sectional view of a part of the semiconductor light emitting device shown in FIG. 1. FIG. 5 is an energy band diagram of a part of the semiconductor light emitting device shown in FIG. 4, in particular, of its conduction band. This semiconductor light emitting device has a so-called SCH structure.

As shown in FIG. 4, the n-typ e ZnSe/MgS superlattice cladding layer 3 and the p-type ZnSe/MgS superlattice cladding layer 7 are made by alternatingly laminating ZnSe layers 7a as quantum well layers and MgS layers 7b as barrier layers.

In this case, the ZnSe layers and the MgS layers forming the n-type ZnSe/MgS superlattice cladding layer 3 are doped with Cl, for example, as a donor impurity, and exhibit an n-type. In contrast, the p-type ZnSe/MgS superlattice cladding layer 7 is doped with N, for example, as an acceptor impurity, and exhibits a p-type. With regards the p-type ZnSe/MgS superlattice cladding layer 7, modulation doping may be employed to selectively dope N only into the ZnSe layers other than the MgS layers for which doping of acceptor impurities is difficult. In this case, N doped as the acceptor impurity is distributed only at inner sites of the ZnSe layers distant from the interfaces with adjacent layers. This results in substantially perfect prevention of self-compensation attendant to the doping of the acceptor impurity and of generation of SA (self-activated) center. Thus the doping of the acceptor impurity can be attained efficiently.

Figure 6:
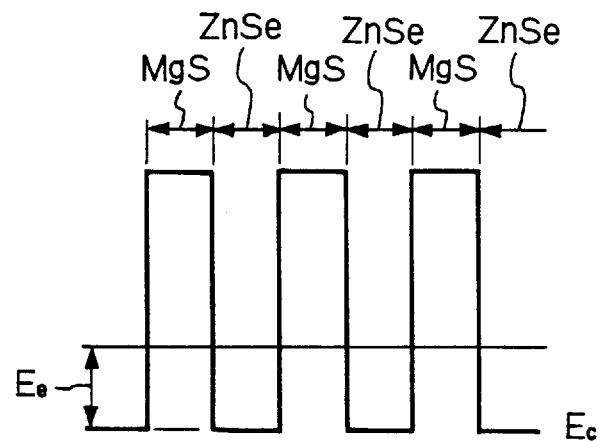
FIG. 6 is an energy band diagram showing a ZnSe/MgS superlattice.
Figure 7A:
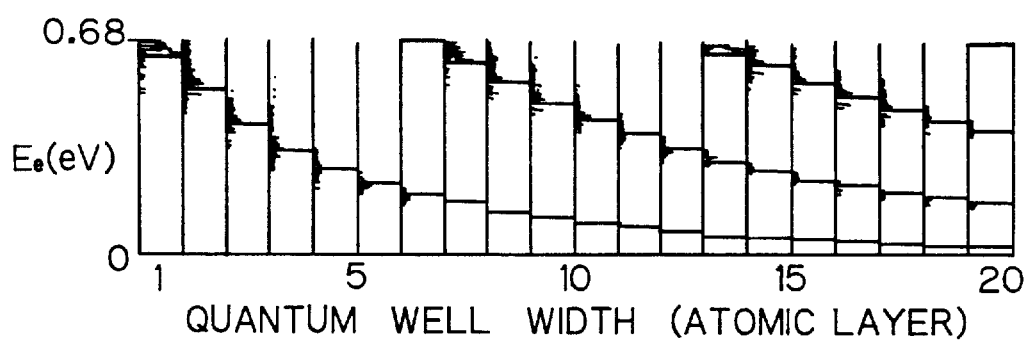
FIGS. 7A and 7B are schematic diagrams showing a result of calculation of quantum levels of electrons in the ZnSe/MgS superlattice shown in FIG. 6, varying the quantum well width.
Figure 7B:
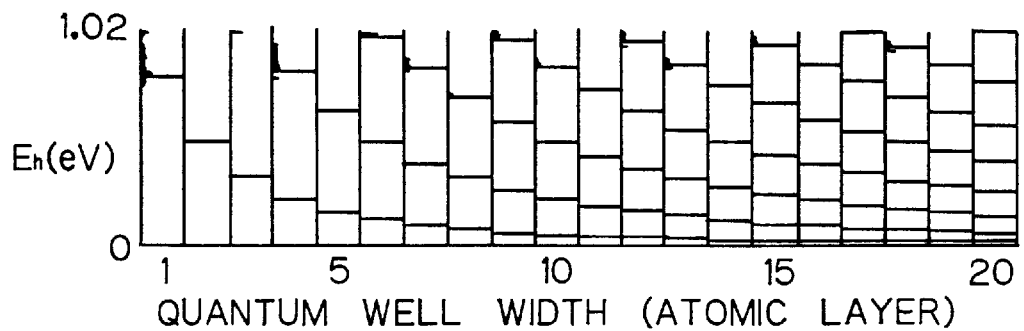
Figure 8A:
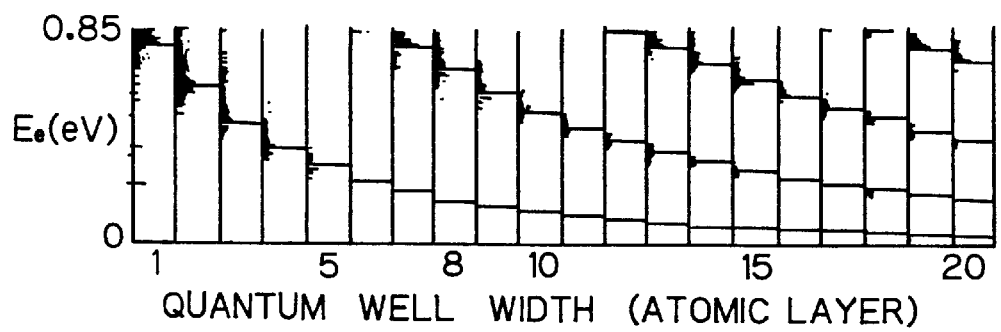
FIGS. 8A and 8B are schematic diagrams showing a result of calculation of quantum levels of electrons in the ZnSe/MgS superlattice shown in FIG. 6, varying the quantum well width.
Figure 8B:
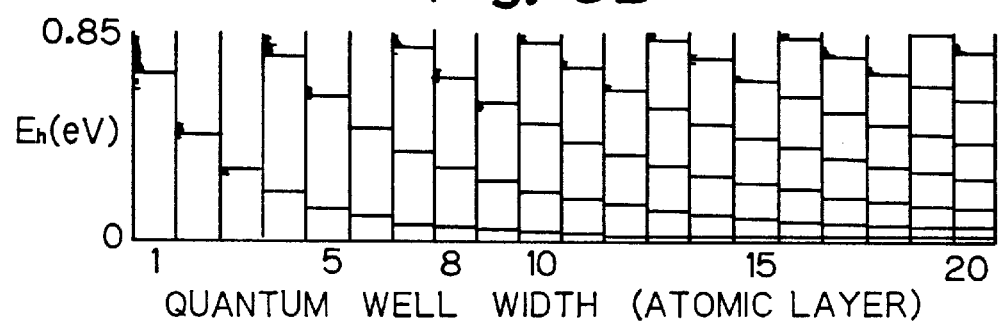
Figure 9A:
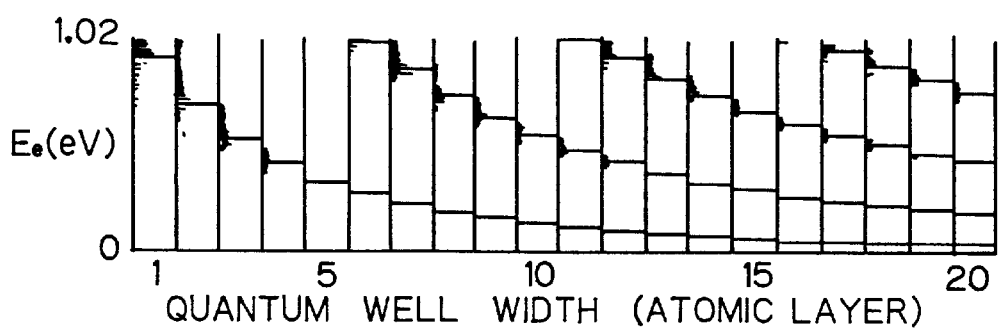
FIGS. 9A and 9B are schematic diagrams showing a result of calculation of quantum levels of electrons in the ZnSe/MgS superlattice shown in FIG. 6, varying the quantum well width.
Figure 9B:
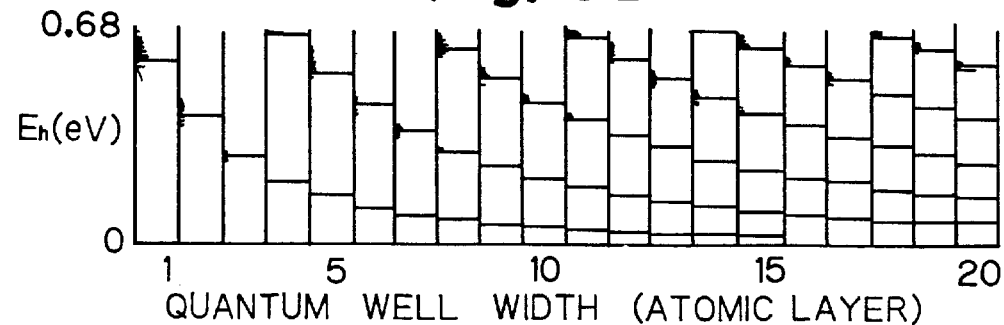

Taking the ZnSe/MgS superlattice with alternating lamination of p-type ZnSe layers (quantum well layers) and MgS layers (barrier layers) as shown in FIG. 6, fixing the thickness of the barrier layer to the thickness of six-atomic layers, while varying the thickness of the quantum well layers, quantum levels Ee of electrons and quantum levels of Eh of holes are calculated for different cases where $\Delta Ec/\Delta Eg$ is 40%, 50% and 60%, respectively (where $\Delta Ec$ is the magnitude of the discontinuity in the conduction band at the interface of the ZnSe layer and the MgS layer, and $\Delta Eg$ is the band gap difference between the ZnSe layer and the MgS layer), and the result is shown in FIGS. 7A, 7B, 8A, 8B, 9A and 9B. Note here that the quantum level Ee of an electron is based on the bottom of the conduction band of the ZnSe layer while the quantum level Eh of a hole is based on the bottom of the valence band of the ZnSe layer. Note also that the calculation used 0.17 $m_0$ and 0.60 $m_0$ ($m_0$ is the mass of an electron in vacuum) as effective masses of electrons and holes in ZnSe and used 0.27 $m_0$ and 0.62 $m_0$ as effective masses of electrons and holes in MgS.

As apparent from FIGS. 7A, 7B, 8A, 8B, 9A and 9B, the band gap difference $\Delta Eg$ in the ZnSe/MgS superlattice whose ZnSe layer has a thickness 1 corresponding to eight atomic layers, i.e. the $(ZnSe)_8$—$(MgS)_8$ superlattice, is about $\Delta Eg\sim 0.2$ eV. When employing the modulation doping, the hole concentration of the entirety of the $(ZnSe)_8$—$(MgS)_8$ superlattice can be $6\times 10^{17}\times\{8/(8+2)\}\sim 5\times 10^{17} cm^{-3}$ by doping N into the ZnSe layers until the hole concentration reaches its saturation value (about $6\times 10^{17} m^{-3}$). Therefore, the hole concentration of the p-type ZnSe/MgS superlattice cladding layer 7 comprising such a $(ZnSe)_8$—$(MgS)_8$ superlattice can be about $5\times 10^{17} cm^{-3}$.

On the other hand, the value of $\Delta Eg$ can readily be increased by the multiquantum barrier (MQB) effect in the superlattice shown in FIG. 6. That is, because of the value as large as $\Delta Ee\sim 0.8$ eV, $\Delta Eg\sim \Delta Ee$ can be realized by the MQB effect.

As described above, according to the first embodiment, by particularly using the p-type ZnSe/MgS superlattice cladding layer 7 as its p-type cladding layer and by doping the acceptor impurity only into the ZnSe layers other than the MgS layers difficult to dope acceptor impurities, the self-compensating effect attendant to the doping of the acceptor impurity can be suppressed effectively. As a result, the hole concentration of the p-type cladding layer can be made higher than that by the use of p-type ZnMgSSe layers as p-type cladding layer. This contributes to realization of a semiconductor laser capable of emitting blue to green light.

Figure 10:
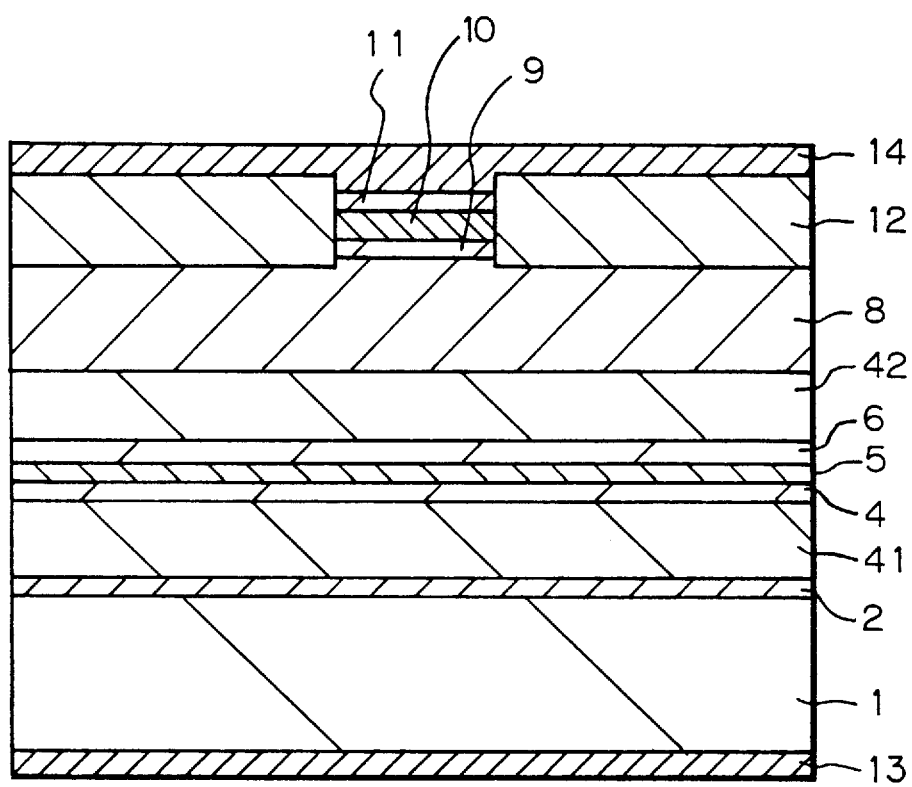
FIG. 10 is a cross-sectional view showing a semiconductor laser according to a second embodiment of the invention.
Figure 11:
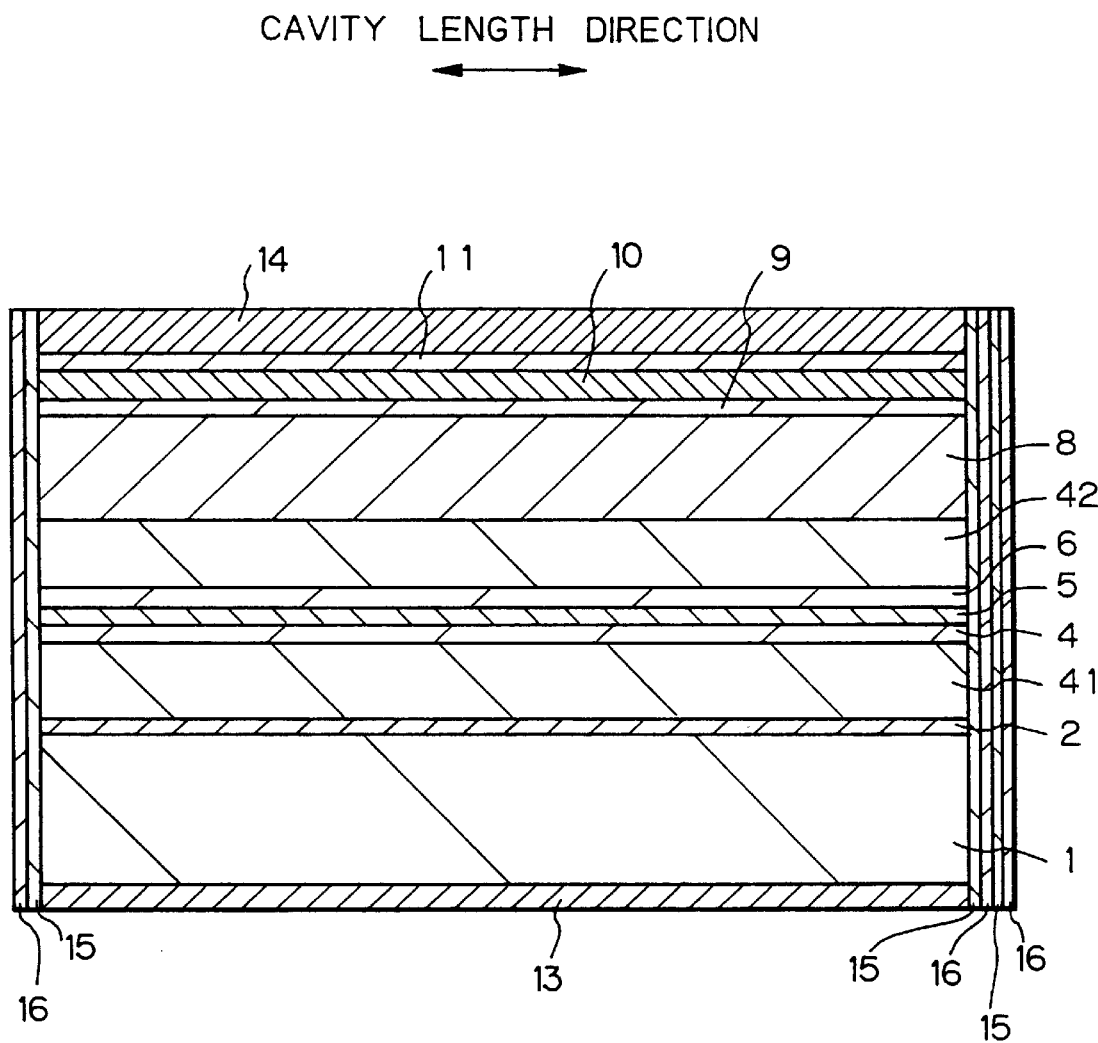
FIG. 11 is a cross-sectional view of the semiconductor laser according to the second embodiment of the invention.

FIGS. 10 and 11 show a semiconductor laser taken as a second embodiment of the invention in a cross-sectional view taken along the line orthogonal to the cavity length direction and in a side elevational view parallel to the cavity length direction.

Figure 12:
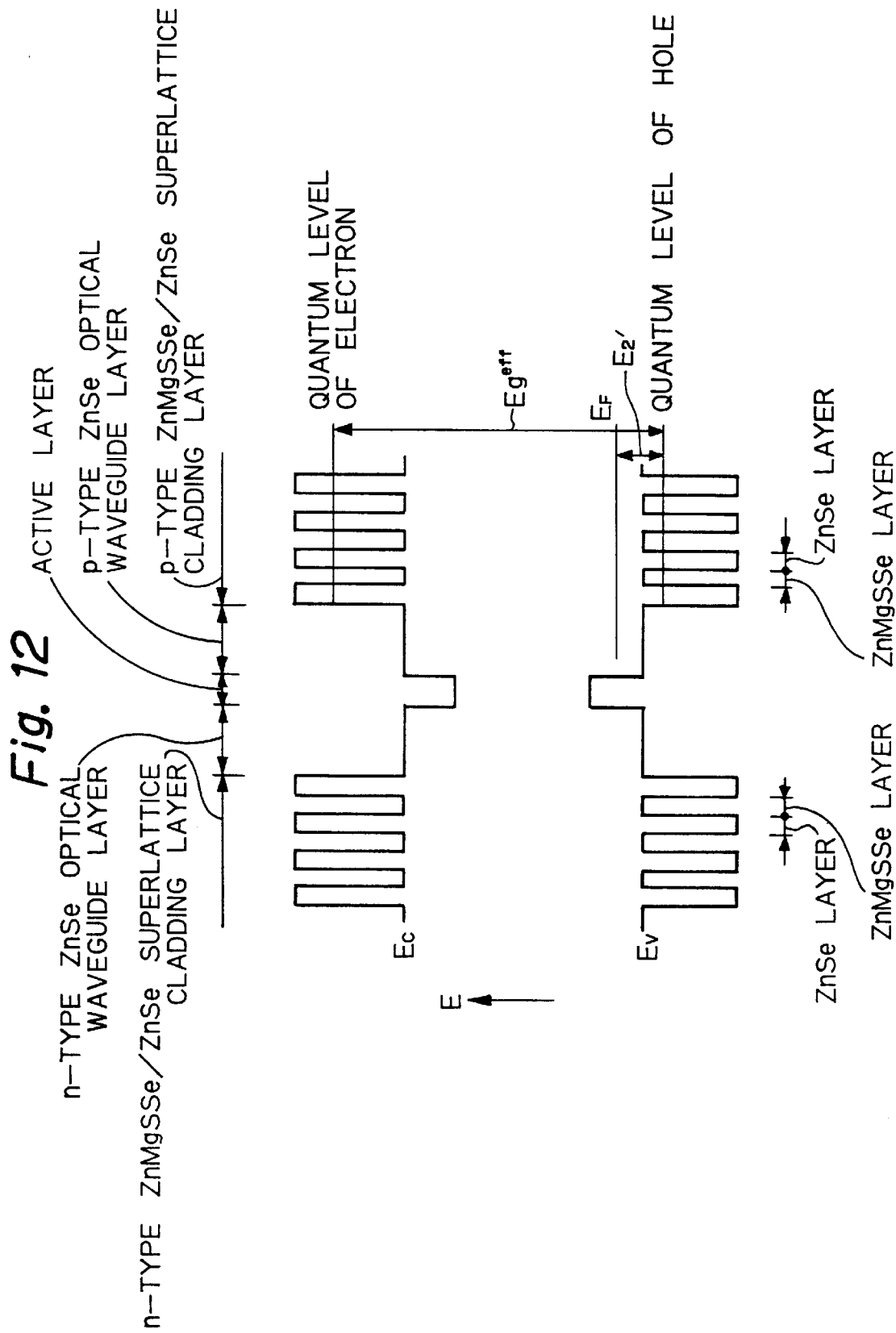
FIG. 12 is an energy band diagram of a part of the semiconductor laser according to the second embodiment of the invention.
Figure 13:
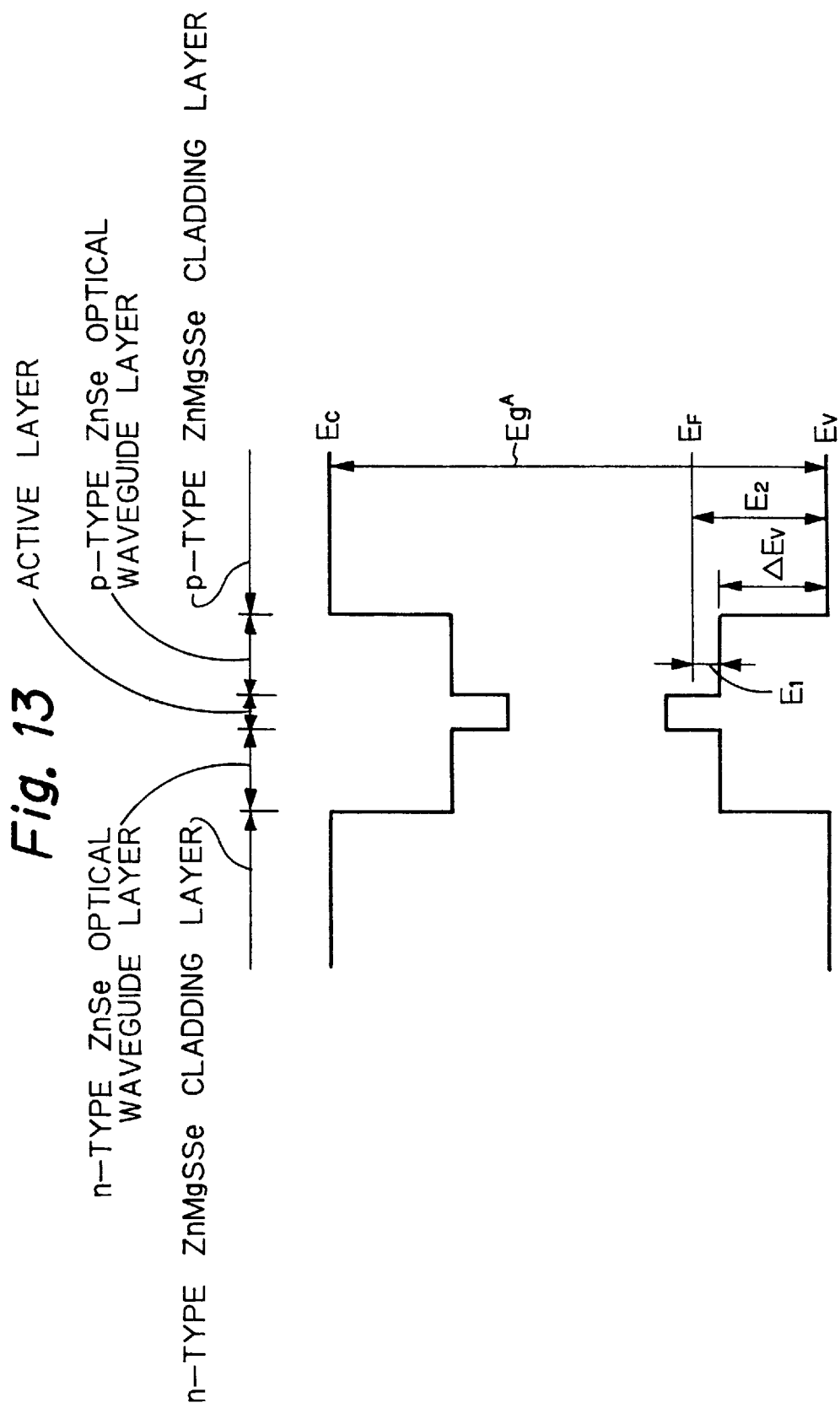
FIG. 13 is an energy band diagram of a part of a semiconductor laser taken for comparison with the energy band diagram of FIG. 12.

The semiconductor laser shown in FIGS. 10 and 11 has substantially the same structure as that shown in FIGS. 1 and 2 except for its n-type superlattice cladding layer 41 and p-type superlattice cladding layer 42 which comprise ZnMgSSe/ZnSe. The p-type ZnMgSSe/ZnSe superlattice cladding layer 42, in particular, is designed to increase the quantum levels only of electrons by quantization, without increasing the quantum levels of holes. Therefore, as shown in FIG. 12, the energy difference E2' between the quantum level of the ground state of a hole corresponding to the top of the substantial valence band in the p-type ZnMgSSe/ZnSe superlattice cladding layer 42 and its Fermi level Ef can be reduced. Thus, as shown in FIG. 13, the hole concentration is made much higher than that in a structure where the cladding layer does not comprise a superlattice.

Figure 14:
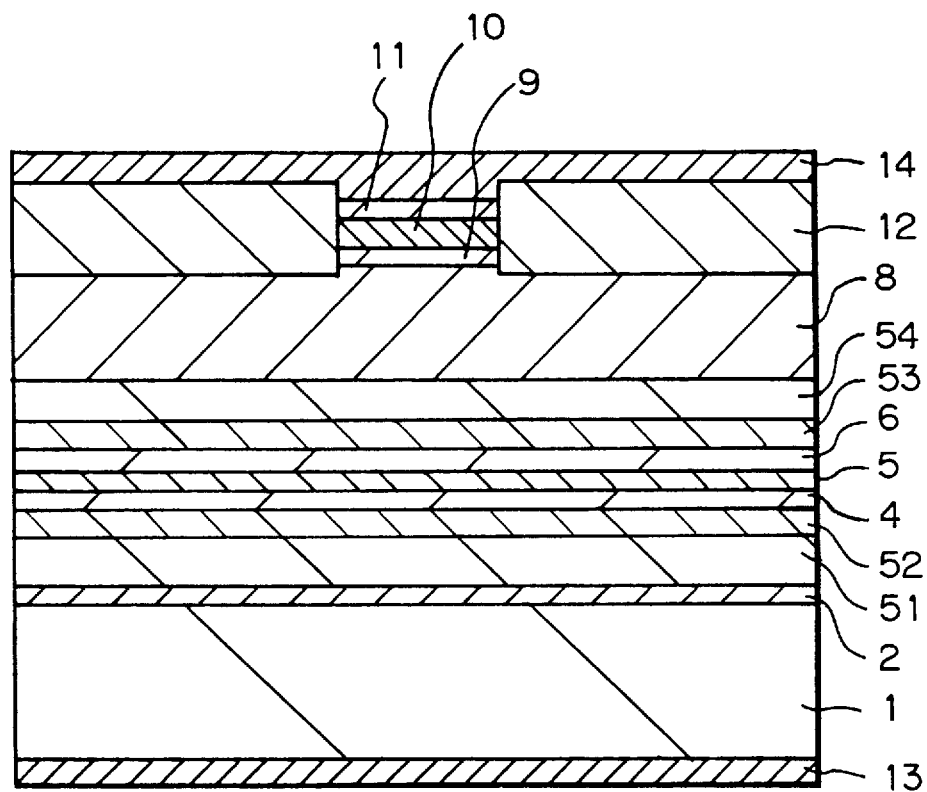
FIG. 14 is a cross-sectional view showing a semiconductor laser according to a third embodiment of the invention.

FIG. 14 shows a cross-sectional view of a semiconductor laser taken as a third embodiment of the invention. The semiconductor laser shown in FIG. 14 has substantially the same structure as that of the semiconductor laser shown in FIG. 10 except for its p-type cladding layer and n-type cladding layer which comprise a two-layered lamination of a ZnMgSe/ZnSe layer and a ZnMgSSe layer. Also the p-type ZnMgSSe/ZnSe superlattice cladding layer 53 in FIG. 14 is designed to increase the quantum levels only of electrons by quantization without increasing the quantum levels of holes, similarly to the p-type ZnMgSSe/ZnSe superlattice cladding layer 42 shown as the second embodiment.

Figure 15:
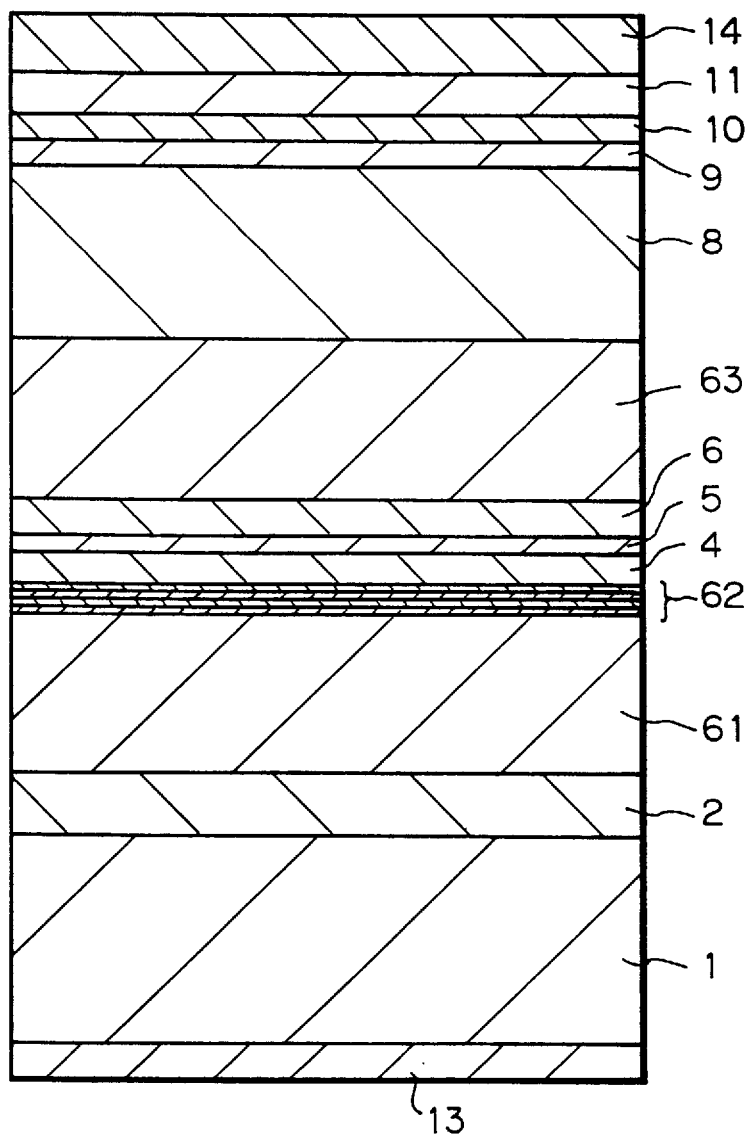
FIG. 15 is a cross-sectional view showing a semiconductor laser according to a fourth embodiment of the invention.

FIG. 15 shows a cross-sectional view of a semiconductor laser taken as a fourth embodiment of the invention. The semiconductor laser shown in FIG. 15 comprises an n-type ZnSe buffer layer 2, n-type ZnMgSSe cladding layer 61, n-type ZnCdSe/ZnSe superlattice layer 62, n-type ZnSe waveguide layer 4, active layer 5, p-type ZnSe waveguide layer 6, p-type ZnMgSSe cladding layer 63, and p-type ZnSSe layer 8 which are stacked in sequence on an n-type GaAs substrate 1. Further stacked in sequence on the p-type ZnSSe layer 8 are p-type ZnSe contact layer 9, p-type ZnSe/ZnTe superlattice layer 10, and p-type ZnTe contact layer 11. Formed on the lower surface of the n-type GaAs substrate 1 and on the upper surfaces of the p-type ZnTe contact layer 11 are an n-side electrode 13 and a p-side electrode 14, respectively. The n-type ZnSe buffer layer 2, n-type ZnMgSSe cladding layer 61, n-type ZnCdSe/ZnSe superlattice layer 62 and n-type ZnSe waveguide layer 4 are doped with Cl. The p-type ZnSe waveguide layer 6, p-type ZnMgSSe cladding layer 63, p-type ZnSSe layer 8, p-type ZnSe contact layer 9, p-type ZnSe/ZnTe superlattice layer 10, and p-type ZnTe contact layer 11 are doped with N.

The semiconductor laser shown in FIG. 15 may have the following structure. First, the mean lattice mismatching value as shown by Equation (1) is defined on the basis of lattice mismatching values of respecive layers of the quantum well.

$$\text{Mean lattice mismatch} = \sum_i \left(\frac{\Delta a}{a}\right)_i \times \frac{d_i}{\sum_i d_i} \quad (1)$$

$$= \Sigma(\text{lattice mismatch of layer } i) \times$$
$$(\text{thickness of layer } i) \times$$
$$(\text{total thickness of layers})$$

The mean lattice mismatching value is set not larger than ±0.7%.

For example, in the case of a superlattice where:
the first layer is a 4 nm-thick ZnCdSe film and has a distortion of +2%;
the second layer is a 10 nm-thick ZnSSe film and has a distortion of −0.6%;
the third layer is a 4nm-thick ZnCdSe film and has a distortion of +2%;
the fourth layer is a 10 nm-thick ZnSSe film and has a distortion of −0.6%; and
the fifth layer is 4 nm-thick ZnCdSe film and has a distortion of +2%,
the mean lattice mismatching value shown by Equation (2) is introduced from Equation (1).

$$\frac{(-0.6 \times 10 \times 2 + 2 \times 4 \times 3)}{(10 \times 2 + 4 \times 3)} = 0.38\% \quad (2)$$

The reason of the use of the aforementioned structure is as follows. That is, it is known through TEM observation that an epitaxial layer comprising a II–VI compound semiconductor has defects of about $10^6 \sim 10^7 \text{cm}^{-2}$.

These defects are assumed to be misfit dislocations by lattice mismatching of the epitaxial layer and stacking faults produced at the interface between the epitaxial layer and the substrate. These defects move or multiply in the active layer during laser oscillation, hence deteriorate the crystalline quality at a great speed, and invite degradation of the laser characteristic. Motion and multiplication of the defects are promoted by recombination of excessive carriers in the crystal.

Motion of dislocations occurring in the process of multiplication of the defects (for example, dislocation) are classified, in general, into two sorts. One of them is glide motion caused by a stress, and the other is climb motion attendant to absorption and discharge of point defects. Consideration is made below, focusing at the glide motion directly propelled by a stress.

Figure 16:
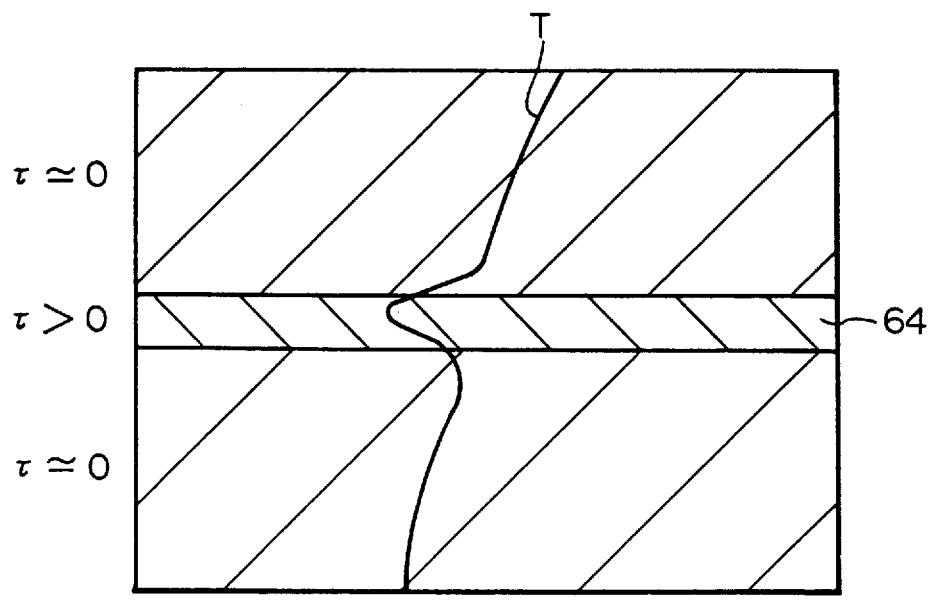
FIG. 16 is a conceptual diagram of dislocation in a quantum well.
Figure 17:
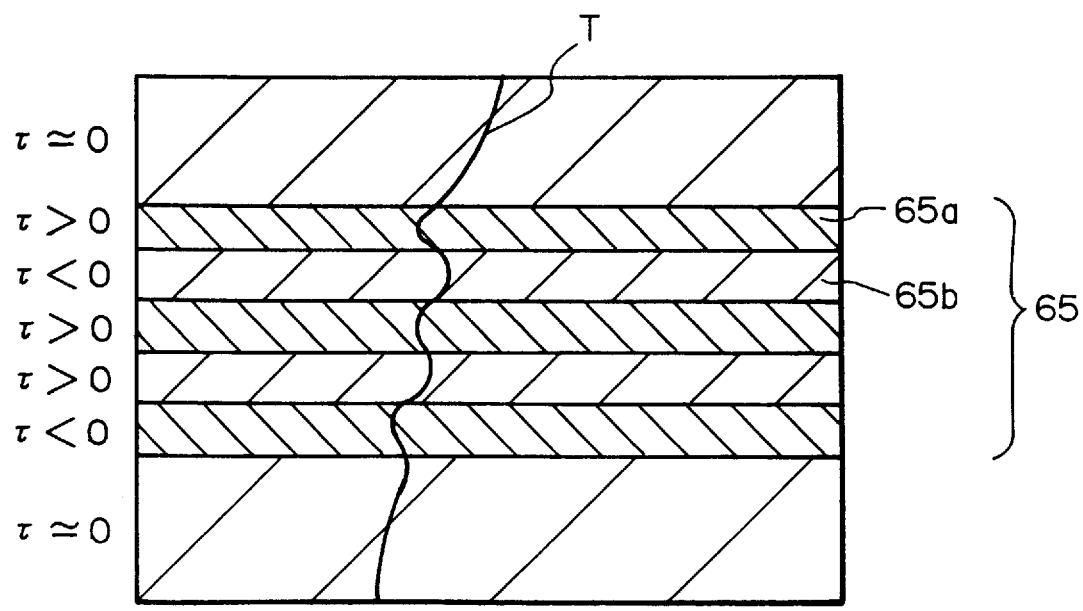
FIG. 17 is a conceptual diagram of dislocation in a multiquantum well.
Figure 18:
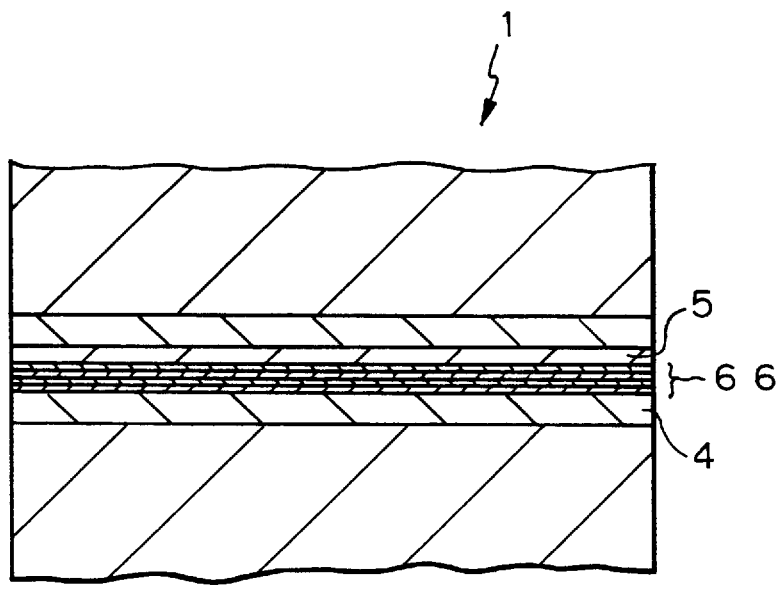
FIG. 18 is a cross-sectional view showing a partial modification of the semiconductor laser according to the fourth embodiment of the invention.
Figure 19:
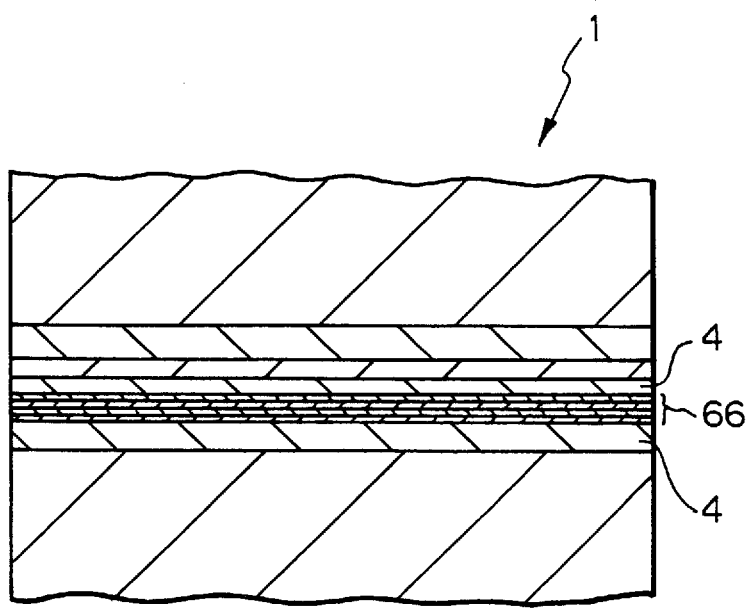
FIG. 19 is a cross-sectional view showing a partial modification of the semiconductor laser according to the fourth embodiment of the invention.

The concept of dislocation in a quantum well is explained here with reference to FIGS. 16 and 17. FIG. 16 shows the concept of dislocation in a single distorted quantum well, and FIG. 17 shows the concept of dislocation in a multiquantum well of a distortion compensating type.

When dislocation T penetrate the single distorted quantum well 64 as shown in FIG. 16, an intra-plane stress $\tau$ ($\tau$>0) is being applied to the single distorted quantum well layer 64. A portion of the dislocation T in the distorted layer becomes liable to move due to the stress $\tau$.

On the other hand, as shown in FIG. 17, the superlattice 65 comprises at least one set of lamination of a first layer 65a having a larger lattice constant than that of the semiconductor substrate (not shown) and a second layer 65b having a smaller lattice constant than that of the semiconductor substrate.

In the superlattice having the aforementioned structure, since the stress $\tau$ applied to the well layer (for example, $\tau$>0) and the stress $\tau$ (for example, $\tau$<0) are different in sign, directions for the same dislocation T to tend to move in respective layers are completely opposite. Under the condition where opposite stresses $\tau$ are applied to respective adjacent sections of dislocation T, the dislocation becomes difficult to move. By employing this structure, a longer life by one digit or nearly three digits than existing devices was confirmed. Location of the superlattice 65 in the fourth embodiment may be either between the n-type guide layer 4 and the active layer 5 or in the n-type guide layer 4.

Figure 20:
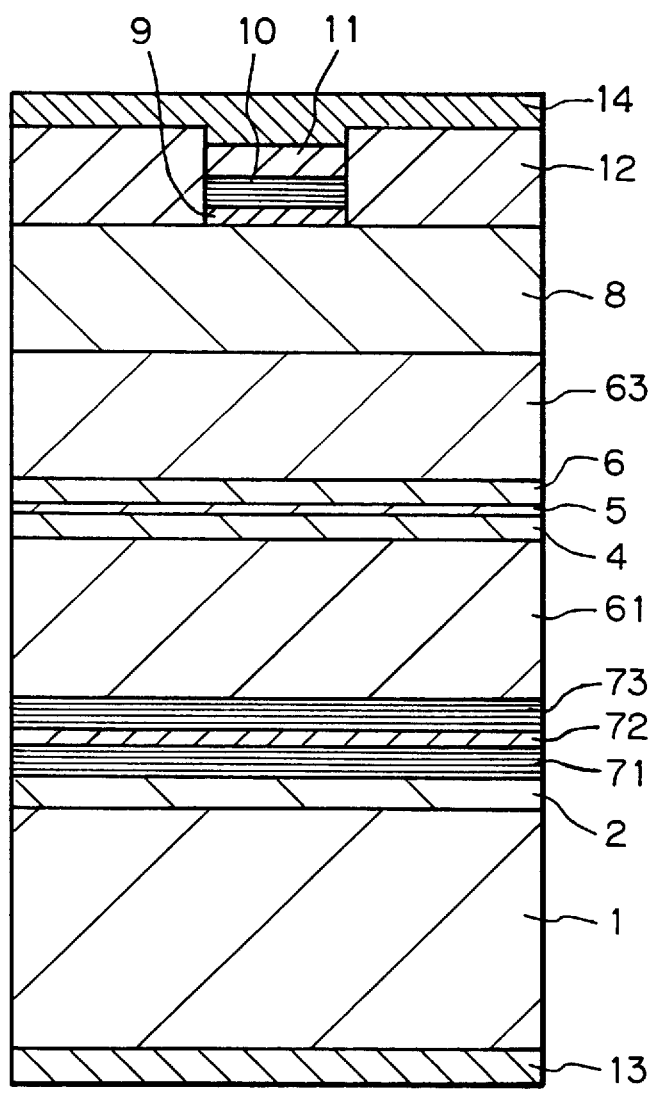
FIG. 20 is a cross-sectional view showing a semiconductor laser according to a fifth embodiment of the invention.

FIG. 20 shows a semiconductor light emitting laser taken as a fifth embodiment of the invention. The semiconductor laser according to FIG. 20 comprises an n-type ZnSe buffer layer 2, defect decomposing layer 71, intermediate layer 72, and defect blocking layer 73, sequentially stacked on an n-type GaAs substrate 1. Further stacked on the defect blocking layer 73 are, in sequence, an n-type ZnMgSSe cladding layer 61, n-type ZnSe waveguide layer 4, active layer 5, p-type ZnSe waveguide layer 6, p-type ZnMgSSe cladding layer 63, and p-type ZnSSe layer 8. Further stacked on the p-type ZnSSe layer 8 are, in sequence, a p-type ZnSe contact layer 9, p-type ZnSe/ZnTe superlattice layer 10, and p-type ZnTe contact layer 11 in the form of a stripe extending vertical to the plane of the drawing sheet. Formed on the bottom surface of the n-type GaAs substrate 1 and on the upper surface of the p-type ZnTe contact layer 11 and the insulating layer 12 are an n-side electrode 13 and a p-side electrode 14, respectively.

FIG. 21 is shown for explaining behaviors of the defect decomposing layer 71 and the defect blocking layer 73 of the semiconductor laser shown in FIG. 20. In FIG. 21, hatching for representation of cross sections is omitted for simplicity. As shown in FIG. 21, when a II–VI compound semiconductor layer is epitaxially grown on the (001) plane of a compound semiconductor substrate (not shown), a stacking fault originating from the interface with the semiconductor body is generated in the II–VI compound semiconductor layer. Although the stacking fault can be reduced in density of generation by paying some consideration to the pretreatment of the semiconductor body prior to the crystalline growth, it is difficult to reduce the density of generation to zero. It is therefore important to suppress the stacking fault to a minimum value.

It is apparent from an analysis through a transmission electron microscope (TEM) that the stacking fault Sf lies on the {111} plane starting from the interface between the semiconductor substrate and the buffer layer, and represents a triangular stacking fault Sf accompanied by a Frank's fixed dislocation Df whose Burger's vector is of the ⅓<111>type.

The stacking fault Sf generated at the interface between the semiconductor substrate and the buffer layer is decomposed into perfect dislocation Dc with a Burger's vector of the ½<119>type and Shockley's partial dislocation Ds with a Burger's vector of the ⅙<210>type. Then, Franck's fixed dislocation Df at an end of the stacking fault Sf causes a reaction such as ⅓[111]–½[101]+⅙[−12−1] or the like.

The perfect dislocation Dc can freely move due to a stress field in the crystal, or the like. The Shockley's partial dislocation Ds is accompanied by a stacking fault Sf as the Franck's fixed dislocation Df is. In this case, the stacking fault Sf terminating at the Shockley's partial dislocation Ds remain; however, it can readily move within the {111} plane due to gliding motion.

Therefore, the defect decomposing layer 71 behaves to decompose the non-movable Franck's fixed dislocation Df into the complete dislocation Dc and the Shockley's partial dislocation Ds which are readily movable due to the stress field in the crystal. These newly formed defects are easy to block by an artificial superlattice. These newly formed defects intrudes upward beyond the defect decomposing layer 71; however, the defect blocking layer 73 prevents upward intrusion of the defects beyond it, and reorients the defects in a direction parallel to the major (001) plane of the semiconductor substrate. Thus the growth of the defects can be suppressed effectively.

The defect decomposing layer 71 shown in FIG. 20 may be made, for example, by stacking five layers of superlattices each comprising a ZnSe layer and a ZnSSe layer, 1 nm thick, respectively. The defect blocking layer 73 may be made, for example, by stacking five layers of superlattices each comprising a ZnMgSSe layer and a ZnSSe layer, 1 nm thick, respectively. The intermediate layer 72 can be omitted.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the embodiments have been described as applying the invention to semiconductor lasers having SCH structures, the invention may also be applied to semiconductor lasers having DH structures.

Similarly, although the embodiments have been described as applying the invention to semiconductor lasers, the invention may also be applied to light emitting diodes using II–VI compound semiconductors.

What is claimed is:

1. A semiconductor light emitting device comprising:
    a first cladding layer having one of n-type and p-type conductivity, an active layer, and a second cladding layer having another one of n-type and p-type conductivity on a semiconductor substrate,
    said cladding layer having the p-type conductivity comprising a II–VI semiconductor superlattice structure, said structure being composed of a plurality of Mg including layers and a plurality of Mg excluding layers.

2. A semiconductor light emitting device according to claim 1, wherein within said superlattice structure, p-type dopant beng doped only in said Mg excluding layers.

3. A semiconductor light emitting device according to claim 1 wherein said superlattice has well layers and barrier layers which are substantially lattice-matched with said substrate.

4. A semiconductor light emitting device according to claim 3 wherein said superlattice comprises ZnSe and ZnMgSSe.

5. A semiconductor light emitting device according to claim 3 wherein said superlattice comprises ZnSe and MgS.

6. A semiconductor light emitting device according to claim 3 wherein said well layers and said barrier layers of said superlattice have a thickness of several atoms.

* * * * *